US010916930B2

(12) United States Patent
Richards et al.

(10) Patent No.: US 10,916,930 B2
(45) Date of Patent: Feb. 9, 2021

(54) ELECTRICAL POWER SYSTEMS

(71) Applicant: General Electric Technology GmbH, Baden (CH)

(72) Inventors: Simon Richards, Staffordshire (GB); Joao Vieira De Jesus, Staffordshire (GB)

(73) Assignee: General Electric Technology GmbH, Baden (CH)

( * ) Notice: Subject to any disclaimer, the term of this patent is extended or adjusted under 35 U.S.C. 154(b) by 248 days.

(21) Appl. No.: 16/081,444

(22) PCT Filed: Mar. 1, 2017

(86) PCT No.: PCT/EP2017/054713
§ 371 (c)(1),
(2) Date: Aug. 31, 2018

(87) PCT Pub. No.: WO2017/148981
PCT Pub. Date: Sep. 8, 2017

(65) Prior Publication Data
US 2019/0074681 A1 Mar. 7, 2019

(30) Foreign Application Priority Data

Mar. 3, 2016 (EP) .................................. 16275040

(51) Int. Cl.
H02H 3/04 (2006.01)
H02H 3/32 (2006.01)
(Continued)

(52) U.S. Cl.
CPC ............ H02H 3/044 (2013.01); G01R 31/327 (2013.01); G01R 31/62 (2020.01); H02H 3/32 (2013.01); H02H 7/26 (2013.01)

(58) Field of Classification Search
CPC ............ H02H 3/00; H02H 3/044; H02H 3/32; H02H 7/26; G01R 31/62; G01R 31/327
See application file for complete search history.

(56) References Cited

U.S. PATENT DOCUMENTS 8,451,574 B2 * 5/2013 Das ..................... H02H 7/0455
361/94
9,726,706 B1 * 8/2017 Zhang .................... G01R 31/50
(Continued)

FOREIGN PATENT DOCUMENTS

EP 1348970 A1 10/2003
WO 2008034400 A1 3/2008

OTHER PUBLICATIONS

European Search Report and Written Opinion dated Nov. 8, 2016 which was issued in connection with patent application No. EP16275040.0 which was filed on Mar. 3, 2016.
(Continued)

Primary Examiner — Gary L Laxton
(74) Attorney, Agent, or Firm — Eversheds Sutherland (US) LLP

(57) ABSTRACT

In the field of electrical power systems there is provided a method of supervising the operation of a plurality of current transformers that are arranged in respective current transformer within differing protection zones of a multi-phase electrical power system. The method of supervising comprises the steps of: (a) identifying a faulty protection zone within the electrical power system; (b) identifying a faulty current transformer group within the faulty protection zone; and (c) identifying faulty phase(s) within the faulty current transformer group within the faulty protection zone.

12 Claims, 2 Drawing Sheets

(51) Int. Cl.
    *H02H 7/26*     (2006.01)
    *G01R 31/62*     (2020.01)
    *G01R 31/327*     (2006.01)

(56) References Cited

U.S. PATENT DOCUMENTS

| | | |
|---|---|---|
| 2006/0198065 A1 | 9/2006 | Guzman-Casillas et al. |
| 2007/0014062 A1* | 1/2007 | Fischer ............... H02H 1/0007 361/62 |
| 2016/0149390 A1* | 5/2016 | Donolo ............... H02H 3/093 322/27 |

OTHER PUBLICATIONS

International Search Report and Written Opinion dated May 4, 2017 which was issued in connection with PCT application No. PCT/EP2017/054713 which was filed on Mar. 1, 2017.

\* cited by examiner

ELECTRICAL POWER SYSTEMS

BACKGROUND OF THE INVENTION

This invention relates to a method of supervising the operation of a plurality of current transformers arranged in respective current transformer groups within differing protection zones of a multi-phase electrical power system, and to a protection device for supervising the operation of such a plurality of current transformers.

Electrical power systems, such as those concerned with electricity generation, transmission or distribution, with industrial processes, or with transportation, typically include one or more so-called intelligent electronic devices (IEDs) which measure, protect, control and monitor the electrical power system in which they are incorporated.

Such IEDs receive measured current values at various points within a given electrical power system from one or more corresponding current transformers and use those current values to carry out the aforementioned functionality.

BRIEF SUMMARY

According to a first aspect of the invention there is provided a method of supervising the operation of a plurality of current transformers arranged in respective current transformer groups within differing protection zones of a multi-phase electrical power system, the method of supervising comprising:

identifying a faulty protection zone within the electrical power system;

identifying a faulty current transformer group within the faulty protection zone; and identifying one or more faulty phases within the faulty current transformer group.

Identifying a faulty protection zone within the electrical power system decreases the complexity associated with and the computational effort subsequently required to identify a faulty current transformer group since it reduces the number of potentially faulty current transformer groups that have to be considered.

Meanwhile, identifying a faulty current transformer group within the faulty protection zone avoids the need to disable the whole protection zone, e.g. while a problem persists with the current measurements provided by one or more specific current transformers within a given current transformer group, and so allows the remainder of the protection zone to continue in service.

In addition, further identifying one or more faulty phases within the faulty current transformer group helps to more accurately and therefore more efficiently direct maintenance attention whereby the downtime associated with any faulty current transformer group is minimised.

Step (a) of identifying a faulty protection zone within the electrical power system includes comparing a differential current for each protection zone with a predetermined differential current threshold and identifying a protection zone as being faulty when the differential current for the said protection zone exceeds the differential current threshold.

Such a step is able reliably and repeatedly to identify a faulty protection zone.

Optionally step (b) of identifying a faulty transformer group within the faulty protection zone includes:

determining for each current transformer group within the faulty protection zone a current ratio indicative of the balance between phases within the said current transformer group; and identifying as being faulty the current transformer group with a current ratio significantly higher than the current ratio of the or each other current transformer group.

In an embodiment of the invention, the determined current ratio for each current transformer group may be the ratio of one of negative phase sequence current or a difference between maximum and minimum current within a given current transformer group to any one of positive phase sequence current, a maximum current within the given current transformer group or an average current within the given current transformer group.

Such foregoing steps are able to reliably and repeatedly identify a faulty current transformer group.

In an embodiment of the invention step (c) of identifying one or more faulty phases within the faulty current transformer group includes:

measuring the phase current flowing in each phase of the faulty current transformer group; and identifying as being faulty the or each phase with a phase current significantly lower than a current reference.

Optionally the current reference is one of:

the maximum measured phase current within the said faulty current transformer group;

an average measured phase current within the said faulty current transformer group;

the positive phase sequence current of the said faulty current transformer group; and the negative phase sequence current of the said faulty current transformer group.

Such steps are able to reliably and repeatedly identify one or more faulty phases within a faulty current transformer group.

A method according to another embodiment of the invention further includes step (d) of remapping the current measurement of the or each faulty phase in the faulty current transformer group identified, to one or more different measurements provided by other current transformers independent of the said identified faulty phase within the faulty current transformer group.

Remapping the current measurements in the aforesaid manner desirably allows continued full operation of the electrical power system while maintenance attention is directed to the or each said faulty current transformer group.

According to a second aspect of the invention there is provided a protection device for supervising the operation of a plurality of current transformers with which it is operatively connected, the current transformers being arranged in respective current transformer groups within differing protection zones of a multi-phase electrical power system of which the protection device is in use a part, the protection device being configured to:

identify a faulty protection zone within the electrical power system;

identify a faulty current transformer group within the faulty protection zone; and identify one or more faulty phases within the faulty current transformer group.

The protection device of the invention shares the benefits associated with corresponding steps in the method of the invention mentioned hereinabove.

BRIEF DESCRIPTION OF THE DRAWINGS

There now follows a brief description of embodiments of the invention, by way of non-limiting example, with reference being made to the following figures in which.

DETAILED DESCRIPTION

Figure 1:
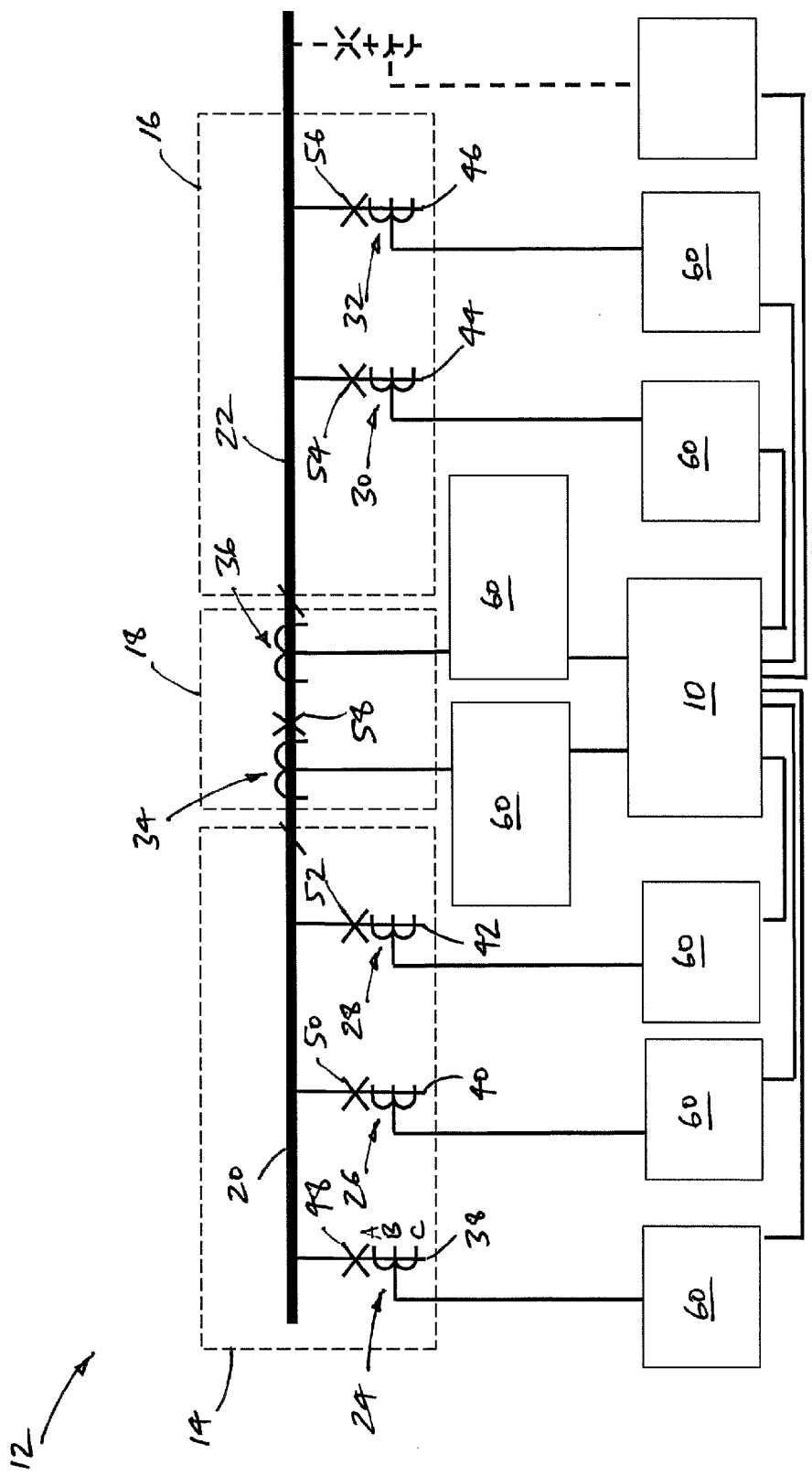
FIG. 1 shows a protection device according to a first embodiment of the invention within a first electrical power system; and (b)

A protection device according to a first embodiment of the invention is designated generally by reference numeral 10, as shown in FIG. 1.

The first protection device 10 forms a part of a first three-phase electrical power system 12 which, by way of example, includes first, second and third protection zones 14, 16, 18. Each of the first and second protection zones 14, 16 is defined by a corresponding first or second single busbar 20, 22, while the third protection zone 18 extends between the first and second protection zones 14, 16. In other embodiments of the invention the first protection device may form a part of an electrical power system having more than or less than three phases, and/or more than or less than three protection zones.

In the embodiment shown, the first protection zone 14, i.e. the first busbar 20, has a plurality of current transformers operatively associated therewith, and the said current transformers are arranged in respective first, second and third three-phase current transformer groups 24, 26, 28. The second protection zone 16, i.e. the second bus bar 22, similarly has a plurality of current transformers operatively associated therewith, with the said current transformers being arranged in respective fourth and fifth current transformer groups 30, 32. Meanwhile the third protection zone 18 includes respective sixth and seventh current transformer groups 34, 36.

Each of the first to fifth current transformer groups 24, 26, 28, 30, 32 is arranged to measure the current flowing in each phase A, B, C between the associated busbar 20, 22 and a corresponding first to fifth feeder network 38, 40, 42, 44, 46. Each such first to fifth current transformer group 24, 26, 28, 30, 32 is also arranged in series with a corresponding first to fifth circuit breaker 48, 50, 52, 54, 56 which can be operated to isolate the associated feeder network 38, 40, 42, 44, 46 from the corresponding busbar 20, 22.

The sixth and seventh current transformer groups 34, 36 share a sixth circuit breaker 58 which is able to electrically isolate the first and second busbars 20, 22 from one another.

Each current transformer group 24, 26, 28, 30, 32, 34, 36 is arranged in communication with a peripheral unit 60 which is, in turn, arranged in operative communication with the first protection device 10. Each peripheral unit 60 receives measured current values from the associated current transformer group 24, 26, 28, 30, 32, 34, 36 and passes these measurements to the first protection device 10.

The first protection device 10 is configured to, in use:

(a) identify a faulty protection zone 14, 16, 18 within the electrical power system 12;

(b) identify a faulty current transformer group 24, 26, 28, 30, 32, 34, 36 within the faulty protection zone 14, 16, 18; and (c) identify one or more faulty phases A, B, C within the faulty current transformer group 24, 26, 28, 30, 32, 34, 36.

More particularly the first protection device 10 takes the form of an intelligent electronic device, i.e. a programmable microcontroller, which includes a protection module (not shown) which is programmed to carry out the aforementioned steps.

The protection module is programmed to identify a faulty protection zone 14, 16, 18 within the electrical power system 12 by comparing a differential current $I_d$, i.e. the difference between the current flowing into a given protection zone 14, 16, 18 and the current flowing out of the said given protection zone 14, 16, 18, for each protection zone 14, 16, 18 with a predetermined differential current threshold $C_{TS}$. The (or each) protection zone 14, 16, 18 with a differential current $I_d$ that exceeds the differential current threshold $C_{TS}$, i.e. according to:

$$I_d > C_{TS}$$

is identified by the protection module as being faulty.

Once the protection module has identified a faulty protection zone 14, 16, 18 it moves on to step (b) of identifying a faulty transformer group 24, 26, 28, 30, 32, 34, 36 within the faulty protection zone 14, 16, 18.

In the embodiment shown the protection module identifies such a faulty transformer group 24, 26, 28, 30, 32, 34, 36 by:

determining for each current transformer group 24, 26, 28, 30, 32, 34, 36 within the faulty protection zone 14, 16, 18 a current ratio hill that is indicative of the balance between phases A, B, C within the said current transformer group 24, 26, 28, 30, 32, 34, 36; and (a) identifying as being faulty the current transformer group 24, 26, 28, 30, 32, 34, 36 with a current ratio $I_2/I_1$ which is significantly higher than the current ratio $I_2/I_1$ of the or each other current transformer group 24, 26, 28, 30, 32, 34, 36 within the said faulty protection zone 14, 16, 18.

In particular, the protection module determines a current ratio $I_2/I_1$ for each current transformer group 24, 26, 28, 30, 32, 34, 36 within the faulty protection zone 14, 16, 18 which is the ratio of negative phase sequence current $I_2$ to positive phase sequence current $I_1$. In this regard a healthy, balanced electrical power system operates with only positive phase sequence current $I_1$, while negative phase sequence current arises only when corresponding three phase current vectors do not form a balanced set.

In other embodiments of the invention the protection module may instead determine a current ratio for each current transformer group 24, 26, 28, 30, 32, 34, 36 within the faulty protection zone 14, 16, 18 which is:

(a) the ratio of negative phase sequence current $I_2$ to a maximum current $I_{max}$ or an average current $I_{average}$ within the given current transformer group, i.e.

$$\frac{I_2}{I_{max}} \text{ or } \frac{I_2}{I_{ave}}$$

or, the ratio of a difference between maximum and minimum currents $I_{max} - I_{min}$ within the given current transformer group to the positive phase sequence current $I_1$, the maximum current $I_{max}$ within the given current transformer group, or the average current $I_{average}$ within the given current transformer group, i.e.

$$\frac{I_{max} - I_{min}}{I_1} \text{ or } \frac{I_{max} - I_{min}}{I_{max}} \text{ or } \frac{I_{max} - I_{min}}{I_{ave}}$$

Meanwhile, returning to the protection module of the first protection device 10, it identifies a faulty current transformer group 24, 26, 28, 30, 32, 34, 36, i.e. a current transformer group 24, 26, 28, 30, 32, 34, 36 with a current ratio $I_2/I_1$ which is significantly higher than the current ratio $I_2/I_1$ of the or each other current transformer group 24, 26, 28, 30, 32, 34, 36 within the said faulty protection zone 14, 16, 18, by calculating either an average current ratio $I_2/I_1$ or a median current ratio for all of the current transformers groups 24, 26, 28, 30, 32, 34, 36 in the given faulty protection zone 14, 16, 18 and accordingly establishing which current transformer group 24, 26, 28, 30, 32, 34, 36 has a current ratio $I_2/I_1$ that is higher than the average current ratio plus a stability threshold or the median current ratio plus a stability threshold.

In other words, the protection module identifies a faulty current transformer group 24, 26, 28, 30, 32, 34, 36 by establishing the or each current transformer group 24, 26, 28, 30, 32, 34, 36 which has a current ratio that is greater than a current ratio threshold derived from the average current ratio or median current ratio of all current transformer groups 24, 26, 28, 30, 32, 34, 36 within a given faulty protection zone 14, 16, 18.

Once the protection module has identified one or more faulty current transformer groups 24, 26, 28, 30, 32, 34, 36 it proceeds with step (c) of identifying one or more faulty phases A, B, C within a said faulty current transformer group 24, 26, 28, 30, 32, 34, 36.

The protection module is programmed to do this by:

measuring the phase current flowing in each phase A, B, C of the faulty current transformer group 24, 26, 28, 30, 32, 34, 36; and (a) identifying as being faulty the or each phase A, B, C with a phase current significantly lower than a current reference which, in the embodiment shown, is the maximum measured phase current within the said faulty current transformer group 24, 26, 28, 30, 32, 34, 36.

Within the context of the invention, a particular phase current is considered significantly lower than the current reference, i.e. the maximum measured phase current, if it is at or approaching zero.

In other embodiments of the invention the current reference may instead be one of:

an average measured phase current within the said faulty current transformer group;

(a) the positive phase sequence current of the said faulty current transformer group; or (b) the negative phase sequence current of the said faulty current transformer group.

In addition to the foregoing, the protection module of the first protection device 10 is also programmed to remap the current measurement of the or each faulty phase A, B, C in the faulty current transformer group 24, 26, 28, 30, 32, 34, 36 identified, to one or more different measurements provided by other current transformers independent of the said identified faulty phase within the faulty current transformer group 24, 26, 28, 30, 32, 34, 36, if such independent measurement sources are available. Alternatively, an alarm signal may be made to operators, allowing them to take the decision to disconnect the circuit associated with the faulted current transformer group or groups by opening circuit breaker 38, 40, 42, 44, 46, 58; or to switch the affected zone of protection 14, 16, 18 out of service.

Figure 2:
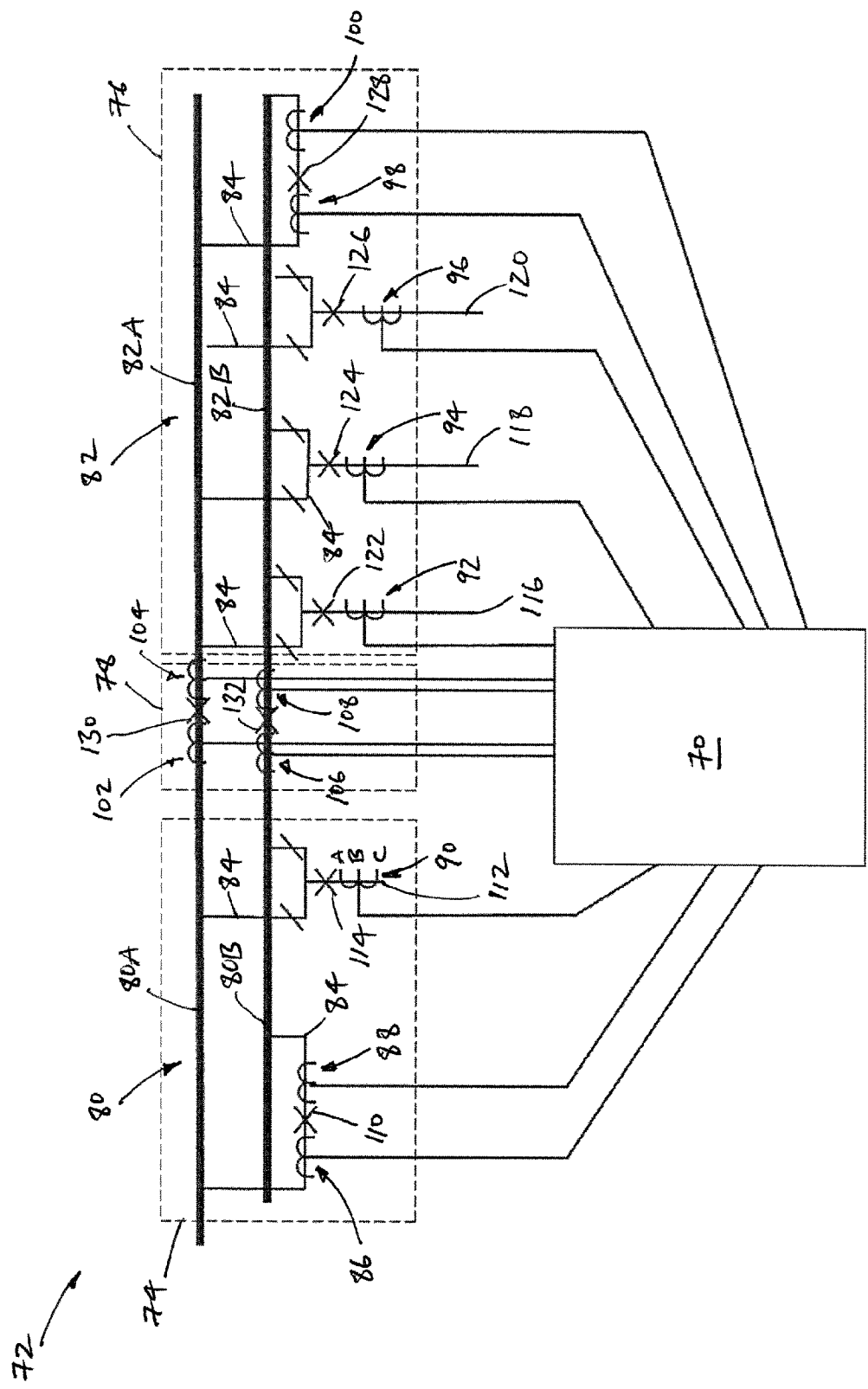
FIG. 2 shows a protection device according to a second embodiment of the invention within a second electrical power system.

FIG. 2 shows a protection device 70 according to a second embodiment of the invention.

The second protection device 70 forms a part of a second three-phase electrical power system 72 which, again by way of example, includes first, second and third protection zones 74, 76, 78.

Each of the first and second protection zones 74, 76 is defined by a corresponding first or second double busbar 80, 82, with the first double busbar 80 being made up of respective first and second busbar portions 80A, 80B and the second double busbar 82 similarly being made up of respective first and second busbar portions 82A, 82B. The third protection zone 78 extends between the first and second protection zones 74, 76. In other embodiments of the invention the second protection device may form a part of an electrical power system having more than or less than three phases, and/or more than or less than three protection zones.

In the second electrical power system 72 the first protection zone 74 includes a plurality of current transformers which are operatively associated in various configurations with the first and second busbar portions 80A, 80B via corresponding bus couplers 84 that interconnect the busbar portions 80A, 80B. The said plurality of current transformers are arranged in respective first, second, and third three-phase current transformer groups 86, 88, 90.

The second protection zone 76 similarly includes a plurality of current transformers which are operatively associated in various configurations with the first and second busbar portions 82A, 82B of the second double busbar 82, via corresponding bus couplers 84 that interconnect the busbar portions 82A, 82B. The current transformers are again similarly arranged in respective fourth, fifth, sixth, seventh and eighth three-phase current transformer groups 92, 94, 96, 98, 100.

In the meantime the third protection zone 78 includes respective ninth, tenth, eleventh and twelfth current transformer groups 102, 104, 106, 108.

The first and second current transformer groups 86, 88 are arranged to measure the current flowing in each phase A, B, C between the busbar portions 80A, 80B of the first double busbar 80 via a first bus coupler 84. The first and second current transformer groups 86, 88 additionally share a first circuit breaker 110 which can electrically isolate the first and second busbar portions 80A, 80B from one another.

Meanwhile the third current transformer group 90 measures the current flowing in each phase A, B, C between a first feeder network 112 and the respective busbar portions 80A, 80B via a second bus coupler 84. A second circuit breaker 114 is associated with the third current transformer group 90 to isolate the first feeder network 112 from the said first and second busbar portions 80A, 80B.

The fourth, fifth and sixth current transformer groups 92, 94, 96 are similarly arranged to measure the current flowing in each phase A, B, C between a corresponding second, third or fourth feeder network 116, 118, 120 and the first and second busbar portions 82A, 82B of the second double busbar 82. Each has a respective third, fourth or fifth circuit breaker 122, 124, 126 associated therewith which is operable to isolate the corresponding feeder network 116, 118, 120 from the said first and second busbar portions 82A, 82B.

The seventh and eighth current transformer groups 98, 100 are arranged to measure the current flowing in each phase A, B, C between the busbar portions 82A, 82B of the second double busbar 82 via a further bus coupler 84. The seventh and eighth current transformer groups 98, 100 additionally share a sixth circuit breaker 128 which can electrically isolate the said first and second busbar portions 82A, 82B from one another.

The ninth and tenth current transformer groups 102, 104 share a seventh circuit breaker 130 which is able to electrically isolate the first busbar portions 80A, 82A from one another, while the eleventh and twelfth current transformer groups 106, 108 share an eighth circuit breaker 132 which can electrically isolate the second busbar portions 80B, 82B from one another.

Each current transformer group 86, 88, 90, 92, 94, 96, 98, 100, 102, 104, 106, 108 is arranged in direct communication with the second protection device 70, whereby the second protection device 70 receives measured current values from each of the said current transformer group 86, 88, 90, 92, 94, 96, 98, 100, 102, 104, 106, 108.

The second protection device 70 is otherwise essentially identical to the first protection device 10, i.e. it includes a protection module that is programmed to:

(a) identify a faulty protection zone 74, 76, 78 within the second electrical power system 72;

(b) identify a faulty current transformer group 86, 88, 90, 92, 94, 96, 98, 100, 102, 104, 106, 108 within the faulty protection zone 74, 76, 78; and (c) identify one or more faulty phases A, B, C within the faulty current transformer group 86, 88, 90, 92, 94, 96, 98, 100, 102, 104, 106, 108.

Furthermore, the protection module of the second protection device 70 is programmed to carry out the aforementioned steps in the same manner as that of the first protection device 10. In further embodiments of the invention the second protection device 70 may also be programmed to carry out the aforementioned steps in one or more of the various other manners described hereinabove in connection with the first protection device 10.

What we claim is:

1. A method of supervising an operation of a plurality of current transformers arranged in respective current transformer groups within differing protection zones of a multi-phase electrical power system, the method of supervising comprising the steps of:
   (a) identifying a faulty protection zone within the multi-phase electrical power system;
   (b) identifying a faulty current transformer group within the faulty protection zone wherein the faulty protection zone comprises one or more current transformer groups, wherein identifying the faulty current transformer group within the faulty protection zone includes:
      determining a respective current ratio indicative of a balance between phases within each of the one or more current transformer groups; and
      identifying the faulty current transformer group with a current ratio significantly higher than the respective current ratio associated with other current transformer group of the one or more current transformer groups; and
   (c) identifying one or more faulty phases within the faulty current transformer group.

2. The method according to claim 1, wherein step (a) of identifying the faulty protection zone within the multi-phase electrical power system includes comparing a differential current for each of the differing protection zones with a predetermined differential current threshold and identifying a differing protection zone as the faulty protection zone when the differential current for the identified differing protection zone exceeds the predetermined differential current threshold.

3. The method according to claim 1, wherein the respective current ratio is a ratio of one of negative phase sequence current or a difference between maximum and minimum current within a given current transformer group to any one of positive phase sequence current, a maximum current within the given current transformer group or an average current within the given current transformer group.

4. The method according to claim 1, wherein step (c) of identifying one or more faulty phases within the faulty current transformer group includes:
   measuring a respective phase current flowing in each phase of the faulty current transformer group; and
   identifying the one or more faulty phases, each of the one or more faulty phases with a phase current significantly lower than a current reference.

5. The method according to claim 4, wherein the current reference is one of:
   (i) a maximum measured phase current within the said faulty current transformer group;
   (ii) an average measured phase current within the said faulty current transformer group;
   (iii) a positive phase sequence current of the said faulty current transformer group; and
   (iv) a negative phase sequence current of the said faulty current transformer group.

6. The method according to claim 1, further including step (d) of remapping a current measurement of each of the one or more faulty phases in the faulty current transformer group identified, to one or more different measurements provided by other current transformers independent of the identified one or more faulty phases within the faulty current transformer group.

7. A protection device for supervising an operation of a plurality of current transformers with which it is operatively connected, the current transformers being arranged in respective current transformer groups within differing protection zones of a multi-phase electrical power system of which the protection device is in use a part, the protection device being configured to:
   (a) identify a faulty protection zone within the multi-phase electrical power system;
   (b) identify a faulty current transformer group within the faulty protection zone, wherein the faulty protection zone comprises one or more current transformer groups, wherein identifying the faulty current transformer group within the faulty protection zone includes:
      determining a respective current ratio indicative of a balance between phases within each of the one or more current transformer groups; and
      identifying the faulty current transformer group with a current ratio significantly higher than the respective current ratio associated with other current transformer group of the one or more current transformer groups; and
   (c) identify one or more faulty phases within the faulty current transformer group.

8. The protection device according to claim 7, wherein the protection device is configured to identify the faulty protection zone within the multi-phase electrical power system by comparing a differential current for each of the differing protection zones with a predetermined differential current threshold and identifying a differing protection zone as the faulty protection zone when the differential current for the identified differing protection zone exceeds the predetermined differential current threshold.

9. The protection device according to claim 7, wherein the respective current ratio is a ratio of one of negative phase sequence current or a difference between maximum and minimum current within a given current transformer group to any one of positive phase sequence current, a maximum current within the given current transformer group or an average current within the given current transformer group.

10. The protection device according to claim 7, wherein the protection device is configured to identify the one or more faulty phases within the faulty current transformer group by:
    measuring a respective phase current flowing in each phase of the faulty current transformer group; and
    identifying the one or more faulty phases, each of the one or more faulty phases with a phase current significantly lower than a current reference.

11. The protection device according to claim 10, wherein the current reference is one of:
    (i) a maximum measured phase current within the said faulty current transformer group;
    (ii) an average measured phase current within the said faulty current transformer group;
    (iii) a positive phase sequence current of the said faulty current transformer group; and
    (iv) a negative phase sequence current of the said faulty current transformer group.

12. The protection device according to claim 7, wherein the protection device is further configured to remap a current measurement of each of the one or more faulty phases in the faulty current transformer group identified, to one or more different measurements provided by other current transformers independent of the identified one or more faulty phases within the faulty current transformer group.

* * * * *